United States Patent [19]

Takasugi

[11] 4,074,335
[45] Feb. 14, 1978

[54] DETECTING CIRCUIT
[75] Inventor: Kazuo Takasugi, Higashi-yamato, Japan
[73] Assignee: Hitachi, Ltd., Japan
[21] Appl. No.: 650,857
[22] Filed: Jan. 21, 1976
[30] Foreign Application Priority Data
Jan. 24, 1975 Japan ................................. 50-9716
[51] Int. Cl.² .......................... H02H 3/08; H02H 5/04
[52] U.S. Cl. ......................................... 361/87; 361/93; 361/99; 361/103; 361/106; 323/89 T; 219/503
[58] Field of Search .................... 317/40 R, 41, 20, 31, 317/33 R, 9 A, 9 AC, 9 R, 13 C, 13 B; 307/94, 92; 323/89 M, 89 P, 89 T, 70, 57; 219/503, 510; 361/103, 106, 88, 92, 93, 98, 186, 87, 79

[56] References Cited
U.S. PATENT DOCUMENTS

| 2,706,765 | 4/1955 | Lengvenis | 323/89 T X |
| 2,720,579 | 10/1955 | Morgan | 323/89 T X |
| 2,727,202 | 12/1955 | Lanfers et al. | 323/89 P X |
| 2,888,645 | 5/1959 | Hoft et al. | 317/31 X |
| 2,910,626 | 10/1959 | Koros | 323/89 P X |
| 3,229,112 | 1/1966 | Hagland et al. | 317/33 R X |
| 3,263,158 | 7/1966 | Bargen et al. | 317/20 X |
| 3,369,108 | 2/1968 | Strachan | 219/503 X |
| 3,374,398 | 3/1968 | Horn et al. | 317/9 R |
| 3,432,643 | 3/1969 | Finnegan et al. | 219/503 X |

Primary Examiner—J D Miller
Assistant Examiner—Patrick R. Salce
Attorney, Agent, or Firm—Craig & Antonelli

[57] ABSTRACT

A detecting circuit comprises a magnetic core having a rectangular magnetic characteristic, a first winding coupled magnetically to the magnetic core, for applying a current to be detected, and a second winding coupled magnetically to the magnetic core, for applying a reference current. An output signal is derived from the second winding.

17 Claims, 29 Drawing Figures

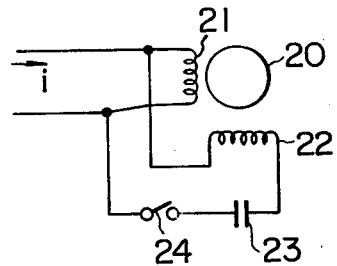
FIG. 9
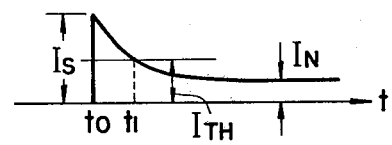
FIG. 10
FIG. 11
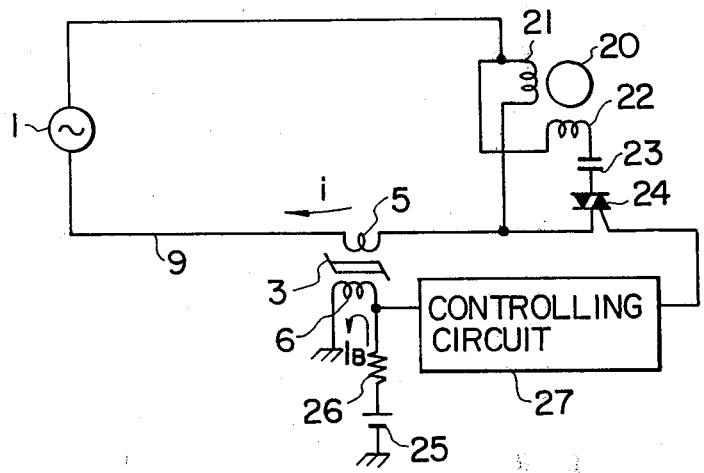
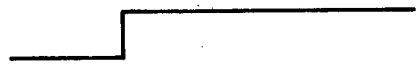
FIG. 12a
FIG. 12b
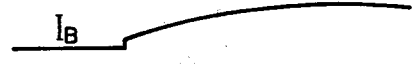
FIG. 12c
FIG. 12d
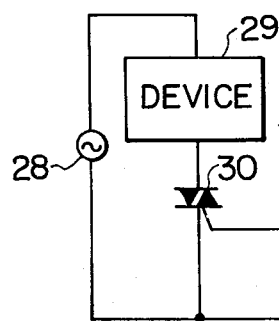
FIG. 13

= e + $e_2$

| | I | II | III |
|---|---|---|---|
| C1 | 0 | 1 | 1 |
| C2 | 0 | 0 | 1 |

DETECTING CIRCUIT

BACKGROUND OF THE INVENTION

This invention relates to a detecting circuit such as an overcurrent detecting circuit, a temperature detecting circuit etc..

In an electric circuit, an overcurrent is often applied to the circuit on the basis of overload, short-circuit trouble, etc. In such a case, in order to protect the electric circuit and to prevent any influence upon other circuits, it is necessary to detect the overcurrent. In various controlling circuits, it is required to detect whether or not the value of a current applied to the controlling circuit is larger than a predetermined set value. Furthermore, in a temperature controlling circuit, a temperature controlled device is controlled by detecting the impedance variation of an element such as a resistor corresponding to the temperature variation of the controlled device and by comparing the detected result with a temperature set point.

In order to compare the value of a current which is applied to an electric circuit with a set point and to control the electric circuit in accordance with the comparison result, some prior art circuits are known. However, such prior art circuits have the following disadvantages. In a prior art detecting circuit for the overcurrent protection, a device such as a bimetal contact is used which utilizes heat produced by a current, an element which utilizes the electromotive force caused by the current, or a resistor in which the resistance varies in accordance with the current variation. However, since such a device has an element such as a heating member, a magnet or a resistor, power is remarkably dissipated by such an element. Furthermore, since a current to be detected is applied directly to the detecting element, it affects upon a circuit from which the current is supplied. In such case, it is impossible to isolate a control circuit from the detecting element in DC manner. Therefore, particular designs for isolation are required. Furthermore, in the prior art circuit, it is difficult to change arbitrarily a reference value, that is, a set point of a detecting current.

In a circuit such as the temperature controlling circuit which detects the impedance variation of an element corresponding to a condition of the controlled device, usually since a detected signal is small in amplitude, it is required to provide a highly sensitive amplifier and the like. In case that an analog signal detected by a circuit such as the temperature controlling circuit is processed digitally, it is required to convert the analog signal to digital form by a high accuracy analog comparator.

SUMMARY OF THE INVENTION

An object of this invention is to provide a detecting circuit which can reduce the power consumption and can eliminate the influence upon other circuits.

An object of this invention is to provide a detecting circuit which can reduce the power consumption and can eliminate the influence upon other circuits.

Another object of this invention is to provide a digital current detecting circuit which has variable threshold.

The further object of this invention is to provide a detecting circuit which is simple in structure and economical.

In order to attain such objects, this invention is characterized by providing a detecting circuit which comprises a magnetic core having a rectangular magnetic characteristic, a first winding coupled magnetically to the magnetic core, for applying a current to be detected, a second winding coupled magnetically to the magnetic core, for deriving the output signal, and means for applying a reference or bias current to one of the first and second windings.

BRIEF DESCRIPTION OF THE DRAWINGS

FIG. 9 is a circuit diagram showing a circuit of a single phase induction motor.

FIG. 10 is a diagram showing the variation of a starting current of the motor shown in FIG. 9.

FIG. 11 is a circuit diagram showing the further embodiment of a detecting circuit according to this invention, which is applied to a circuit for starting the motor shown in FIG. 9.

FIGS. 12a to 12d are diagrams showing signal waveforms of the circuit shown in FIG. 11.

FIG. 13 is a circuit diagram showing the still further embodiment of a detecting circuit according to this invention, which is applied to a temperature controlling circuit.

DETAILED DESCRIPTION OF THE PREFERRED EMBODIMENTS

Figure 1:
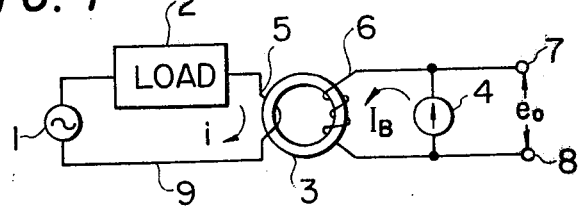
FIG. 1 is a circuit diagram showing an embodiment of a detecting circuit according to this invention.

FIG. 1 shows an embodiment of a detecting circuit according to this invention. In FIG. 1, numeral 1 represents a power source, numeral 2 a load, numeral 3 a magnetic core, numeral 4 a current source, numerals 5 and 6 windings and numerals 7 and 8 output terminals. A closed circuit 9 is constructed by a series circuit of the power source 1, the load 2 and winding 5. The current source 4 is connected between both terminals of winding 6 and the output terminals 7 and 8 are connected to both terminals of winding 6. The windings 5 and 6 are magnetically coupled to the magnetic core 3.

Figure 2:
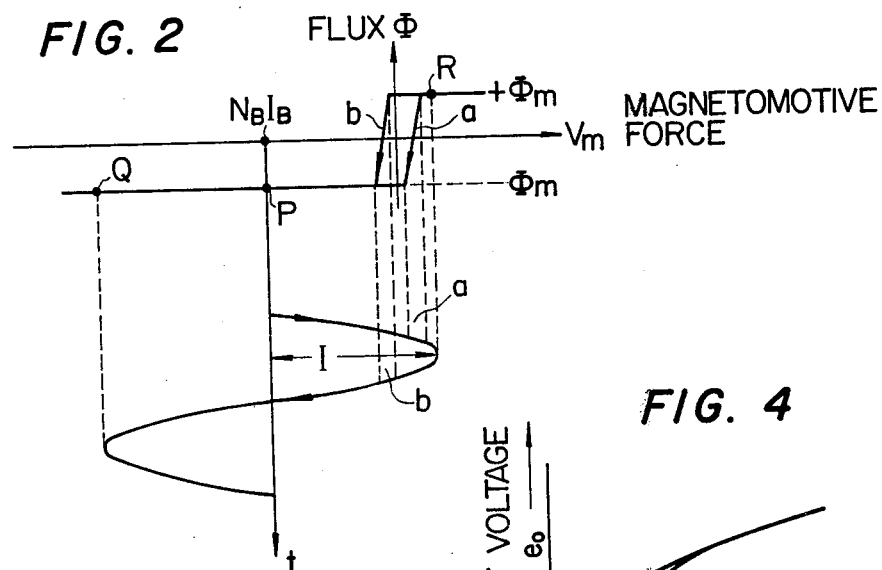
FIG. 2 is a diagram explaining the principle of the circuit shown in FIG. 1.

A current $i$ from the power source 1 is applied to winding 5 and a current $I_B$ from the current source 4 is applied to winding 6. Furthermore, output voltage $e_0$ is derived from the output terminals 7 and 8. A magnetic characteristic of the magnetic core 3 corresponds to a rectangular B-H characteristic such as shown in FIG. 2. In FIG. 2, the abscissa represents magnetomotive force $V_m$ and the ordinate represents magnetic flux $\Phi$. For simplicity, it is assumed that the characteristic of the core 3 corresponds to a perfect saturation characteristic shown in FIG. 2.

When a direct current $I_B$ from the current source 4 is applied to winding 6, the magnetomotive force $N_BI_B$ is produced in the core 3. $N_B$ represents the turn number of winding 6. On the other hand, since a current $i$ is applied to winding 5, the magnetomotive force $Ni$ is produced. Therefore, composite magnetomotive force is produced in the core 3. N represents the turn number of winding 5.

If current $I_B$ is a direct current and current $i$ is a sine wave current with amplitude I as shown in FIG. 2, the operation point of the core 3 varies extending from a point Q to a point R around a center point P. During a period when the operating point varies from point P to point Q and from point Q to point P, a saturating condition in which the flux is a constant value $-\Phi_M$ is held. On the other hand, during a period when the operating point varies from point P to point R and from point R to point P, the operating point passes through $a$ and $b$ on the characteristic curve shown in FIG. 2. Therefore, the flux varies from $-\Phi_m$ to $+\Phi_m$ and from $+\Phi_m$ to $-\Phi_m$. The electromotive force $e_0$ corresponding to the speed of the flux variation is produced across winding 6.

An operating point P is a point corresponding to the magnetomotive force $N_BI_B$. Therefore, if the maximum value NI of the magnetomotive force $Ni$ produced by current $i$ is less than $N_BI_B$, the flux is a constant value $-\Phi_m$ and the electromotive force $e_o$ is not produced. On the other hand, if the maximum value NI is larger than $N_BI_B$, the electromotive force $e_0$ is produced as described above. Therefore, according to output voltage $e_o$ derived from the output terminals, the relation in magnitude between NI and $N_BI_B$ is decided.

Figure 3:
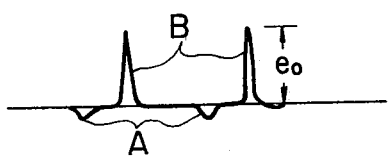
FIG. 3 is a diagram showing a waveform of output voltage in the circuit shown in FIG. 1.

If the influence of the coercive force $\Delta$ in the core 3 is considered, the output voltage $e_0$ is produced at a condition of $NI > N_BI_B + \Delta$. In case that the current $i$ is a sine wave current as shown in FIG. 2, the rate of the variation of a current which is applied to winding 5 when the operating point passes through $a$ and $b$ is different from each other, that is, the rate of the variation of a current which is applied when the operating point passes through $a$ is slower than that of a current which is applied when the operating point passes through $b$. Therefore, the obtained output pulses A and B are different from each other in amplitude as shown in FIG. 3. A and B represent output pulses produced when the operating point passes through $a$ and $b$, respectively.

Figure 4:
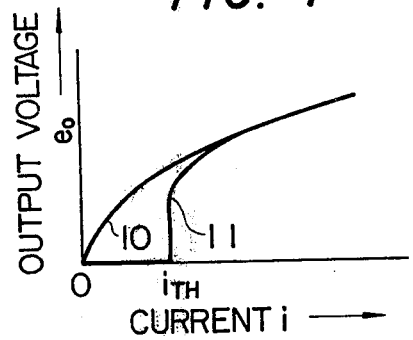
FIGS. 4 and 5 are diagrams showing characteristics of the circuit according to this invention.

If $I_B = 0$, the amplitude $e_0$ of output pulse B is nearly proportional to $i^{1/2}$ as shown at a curve 10 of FIG. 4. If $I_B > 0$, the amplitude $e_0$ rises when the amplitude of current $i$ exceeds a threshold value $i_{TH}$ corresponding to $N_BI_B$ as shown at a curve 11 of FIG. 4, and coincides to curve 10 in the extent that current $i$ is larger.

Figure 5:
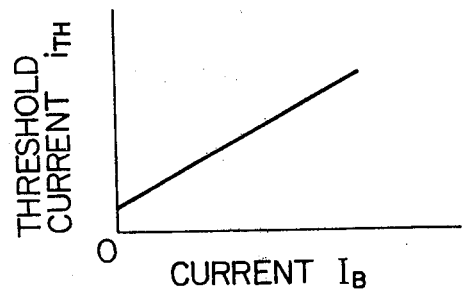
Figure 6A:
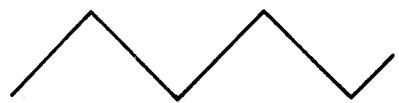
FIGS. 6a to 6e and 7 are diagrams showing various waveforms of currents in the circuit according to this invention.
Figure 6B:
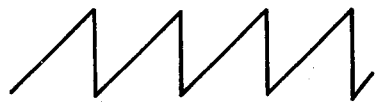
Figure 6C:
Figure 6D:
Figure 6E:

The threshold value $i_{TH}$ varies linearly in accordance with the variation of the amplitude $I_B$ of the direct current as shown in FIG. 5. Therefore, it is seen that the threshold value $i_{TH}$ can be arbitrarily selected in response to $I_B$. As current $i$, can be applied a signal of various types such as shown in FIGS. 6a to 6e. In FIGS. 6a to 6e, FIG. 6a shows a triangular wave, FIG. 6b a saw-toothed wave, FIG. 6c a square wave, FIG. 6d a pulse wave, and FIG. 6e a half rectified wave.

Figure 7:
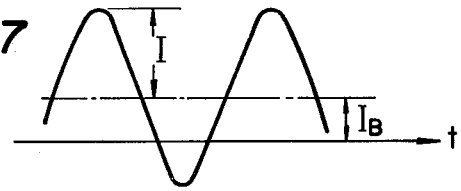

Insofar as the composite magnetomotive force satisfies a relation such as shown in FIG. 2, it is unnecessary to apply separately the currents $i$ and $I_B$ to the windings 5 and 6. For example, if a current from the power source 1 has a direct current component corresponding to $I_B$ and an alternating current component corresponding to I as shown in FIG. 7, the current source 4 in FIG. 1 can be eliminated. On the other hand, if a current from the current source 4 has the same components as described above, the power source 1 can be eliminated.

Figure 8:
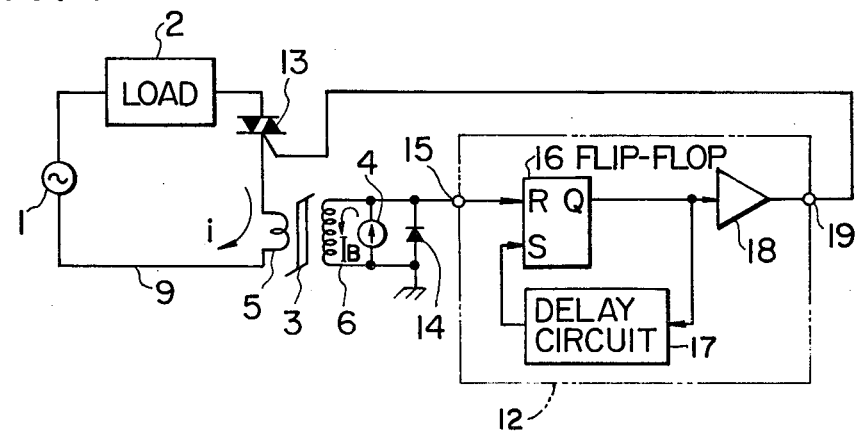
FIG. 8 is a circuit diagram showing another embodiment of a detecting circuit according to this invention, which is applied to an overload protector.

FIG. 8 shows another embodiment of a detecting circuit according to this invention, which is applied to an overcurrent (overload) protective circuit. In FIG. 8, numeral 12 represents a controlling circuit, numeral 13 a switching element such as a SCR, and numeral 14 a diode. In the controlling circuit 12, numeral 15 represents an input terminal, numeral 16 a flip-flop, numeral 17 a delay circuit, numeral 18 a driver and numeral 19 an output terminal.

The switching element 13 is connected serially in the closed circuit 9 having the power source 1, the load 2 such as a motor and winding 5. The diode 14 is connected between both terminals of winding 6. One terminal of winding 6 is connected to input terminal 15 and the other terminal thereof is connected to ground.

The reset terminal R of the flip-flop 16 is connected to input terminal 15 and the output terminal Q thereof is connected to the input terminals of the delay circuit 17 and the driver 18. The output terminal of the delay circuit 17 is connected to the set terminal S of the flip-flop 16. The output terminal of the driver 18 is connected through the output terminal 19 to the controlled electrode of the switching element 13.

When an overcurrent is applied through the load 2 to winding 5, the output voltage $e_0$ is produced across winding 6. This output voltage is applied to the input terminal 15 of the controlling circuit 12. The diode 14 prevents a negative polarity pulse A shown in FIG. 3 from being applied to the controlling circuit 12. In the controlling circuit 12, the voltage $e_0$ from input terminal 15 is applied to the reset terminal R of the flip-flop 16. Thus, the flip-flop 16 is reset and an output signal from the output terminal Q becomes signal "0". Therefore, an OFF signal is supplied through the driver 18 and output terminal 19 to the switching element 13.

When a predetermined reset time elapses after the output signal of the flip-flop 16 becomes "0" state, an output signal is obtained from the delay circuit 17 and is applied to the set terminal S of the flip-flop 16. Therefore, the output state of the flip-flop 16 becomes "1" and an ON signal is applied to the switching element 13. Thus, when the value of a current $i$ which is applied to the closed circuit 9 exceeds a predetermined value, the switching element 13 is turned OFF, thereby protecting the load 2.

The following advantages are obtained by the detecting circuit shown in FIG. 8.

Since the windings 5 and 6 are coupled magnetically to the core 3, the closed circuit 9 and the controlling circuit 12 are isolated from each other. Therefore, the closed circuit 9 is not affected by the other circuits. Furthermore, particular power dissipation for detection is unnecessary.

Since a small ferrite core with about 10 mm $\phi$ diameter can be used as the core 3 even if a signal with low frequency, for example, commercial frequency is used, the circuit is simple in structure and is unexpensive.

If the current $I_B$ of the current source 4 is related with voltage across the power source 1, an ambient temperature, etc., the threshold value $i_{TH}$ can be held at the optimum condition. Furthermore, if current $I_B$, that is, a bias current is changed, it is possible to use the same detecting circuit even if the load 2 is altered. Although currents $i$ and $I_B$ from the power source 1 and the current source 4 are an alternating current and a direct current, respectively, in the above description, these currents $i$ and $I_B$ may be a direct current and an alternating current.

FIGS. 9 to 12 show the further embodiment of a detecting circuit according to this invention, which is applied to the motor starter.

FIG. 9 shows a circuit construction of a single phase induction motor. In FIG. 9, numeral 20 represents a motor, numeral 21 a main coil, 22 a starting coil, 23 a phase advancing capacitor and 24 a switch. At starting condition of the motor, the switch 24 is turned ON. Therefore, currents which are differet in phase flow through the main coil 21 and the starting coil 22 and the rotating magnetic field is produced in the motor, thereby to start the motor.

The switch 24 is turned OFF after the motor is started. The operation of the switch 24 is controlled by a start controlling circuit.

FIG. 10 shows a current $i$ which varies with the passage of time at starting. It is assumed that the motor is started at a time $t_0$. Since the motor is not rotated at time $t_0$, the inverse electromotive force of the main coil 21 is not produced. Thus, a large starting rush current $I_S$ flows in the coil 21. As the motor is rotated, the current $i$ becomes smaller so that it finally becomes equal to a stationary running current $I_N$. The switch 24 is turned OFF at time $t_1$.

In order to execute such control, the switch 24 is turned ON when the motor current $i$ is larger than a threshold value $I_{TH}$ and the switch 24 is turned OFF when $i$ becomes smaller than $I_{TH}$.

FIG. 11 shows a concrete construction of the starter circuit according to this invention. In FIG. 11, numeral 25 represents a direct current power source, numeral 26 a resistor and numeral 27 a controlling circuit. The current source 4 shown in FIG. 1 is constructed by the direct current power source 25 and the resistor 26. Therefore, if the voltage across the power source 25 is E and the resistance of the resistor 26 is R, current $I_B$ which is applied to winding 6 is equal to E/R. The threshold value $I_{TH}$ is decided by current $I_B$ and the turn number $N_B$ of winding 6.

In the controlling circuit 27, when the current of the motor is larger than $I_{TH}$, an output signal is produced so that the switch 24 is turned ON. When the current of the motor becomes smaller than $I_{TH}$, the switch 24 is turned OFF.

An example is explained below, in which a temperature sensitive resistor such as a thermistor, a positive temperature coefficient thermistor (PTC) etc. is used as the resistor 26. In case that voltage across the power source 25 is produced by the power source 1, the voltage across the power source 25 is produced as shown in FIG. 12b when the voltage across the power source 1 is produced at time $t_0$ as shown in FIG. 12a. Since the resistor 26 is the temperature sensitive resistor having a suitable heat time constant, current $I_B$ varies with the lapse of time after time $t_0$ as shown in FIG. 12c or 12d. FIG. 12c shows the variation of current $I_B$ in case that an element such as a thermistor having a negative temperature coefficient is used as the resistor 26 and FIG. 12d shows the variation of current $I_B$ in case that an element such as a PTC having a positive temperature coefficient is used as the resistor 26.

If an overcurrent is detected by a threshold value to protect the motor in the event of an overlaod, it is impossible to distinguish between an overcurrent due to an overload and an overcurrent due to the starting of the motor. In such a case, the starting condition and the overload condition are distinguished by difference between the duration of the overcurrents. That is, if the overcurrent duration is short, the overcurrent condition is regarded as the starting condition. If the overcurrent duration is long, the overcurrent condition is regarded as the overload condition.

In a case that current $I_B$ varies as shown in FIG. 12d, the threshold value corresponding to this current $I_B$ is large during any period after starting. Therefore, a detecting signal is not produced by the starting current. However, if the overcurrent condition is continued during a long period, a detecting signal is produced since the threshold value becomes small. That is, the starting condition and the overload condition are distinguished by means of the automatic variation of the threshold value.

Fig. 13 shows the still further embodiment of a detecting circuit according to this invention, which is applied to a temperature controlling circuit. In FIG. 13, numeral 28 represents a power source, numeral 29 a device for controlling temperature such as a heater, numeral 30 a switch, numeral 31 a controlling circuit, numeral 32 an alternating current source, numeral 33 a temperature sensitive resistor which is arranged at a position to be detected, and numeral 34 a direct current source.

A constant current is applied to winding 5 and a current to be detected is applied to winding 6. The output voltage across winding 5 is applied to the controlling circuit 31. The output of the controlling circuit 31 is applied to the switch 30 which applies voltage across the power source 28 to the device 29. Since the temperature sensitive resistor 33 is connected between winding 6 and the source 34, a current $I_B$ which flows through winding 6 corresponds to a temperature to be measured. A resistor having a positive or negative temperature coefficient can be used as the temperature sensitive resistor 33. It is assumed that an element such as a thermistor having a negative temperature coefficient is used as the resistor 33.

When a temperature to be detected is low, the resistance of the resistor 33 becomes high and current $I_B$ thus becomes small. Therefore, an output pulse is produced across winding 5 and the switch 30 is turned ON by the controlling circuit 31, thereby to apply a current from the power source 28 to the device 29 such as a heater. When the temperature becomes high, the resistance of the resistor 33 becomes low and current $I_B$ thus becomes large. Therefore, no output pulse is produced across winding 5 and the switch 30 is then turned OFF.

The device 29 may be a cooling device. In such a case, inverse operation of the above-description is executed.

If a temperature sensitive resistor is connected in series to the current source 32 and a fixed resistor is used as the resistor 33, a constant current is applied to winding 6 and an alternating current corresponding to the ambient temperature is applied to winding 5.

It is possible to substitute an alternating current source for the direct current source 34 and to substitute a direct current source for the alternating current source 32.

Since a digital sensor for temperature is realized according to the embodiment of FIG. 13, it is unnecessary to provide a circuit such as a comparator with high sensitivity and high accuracy. Therefore, the sensor becomes simple in structure and cheap.

If a sine wave or saw-toothed wave current synchronized with the alternating signal from the power source 28 is used as an alternating current from the current source 32, the switch 30 is phase-controlled in response to the temperature. Therefore, it is possible to realize not only an ON-OFF control of the device 29 but also a proportional control thereof.

If an element having a magnetic resistance effect is used as the resistor 33, it is possible to obtain the resistance corresponding to the magnetic field intensity, thereby to realize a displacement converter. A position controlling device, a contiguity switch, etc. is realized by the use of the converter.

Figures 14, 16:
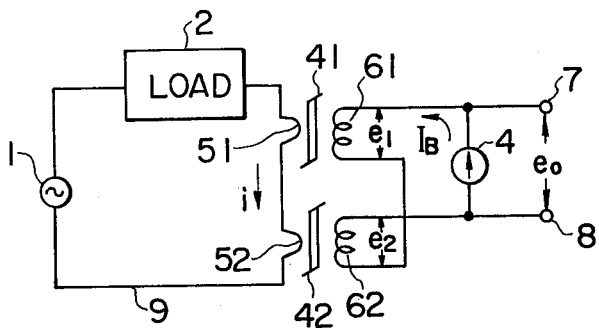
FIG. 14 is a circuit diagram showing the still further embodiment of a detecting circuit according to this invention.
FIGS. 16 and 17a to 17c are diagrams explaining the operation of the circuit shown in FIG. 14.

FIG. 14 shows the still further embodiment of a detecting circuit according to this invention, in which two magnetic cores are used. In FIG. 14, numerals 41 and 42 represent magnetic cores, numerals 51 and 61 windings coupled magnetically to magnetic core 41 and numerals 52 and 62 windings coupled magnetically to magnetic core 42. Windings 51 and 52 are connected in series and are inserted in the closed circuit 9. Windings 61 and 62 are connected serially in the inverse polarities to each other. The current $I_B$ from the current source 4 is applied in common to windings 61 and 62.

Figure 15A:
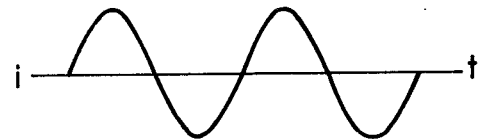
FIGS. 15a to 15d are diagrams showing signal waveforms of the respective parts of the circuit shown in FIG. 14.
Figure 15B:
Figure 15C:
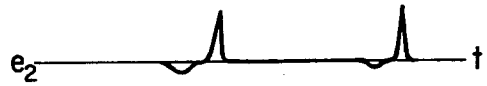
Figure 15D:
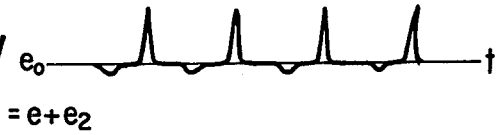

In a condition that output voltage $e_0$ is produced as shown in FIG. 1, output voltage $e_1$ and $e_2$ such as shown in FIGS. 15b and 15c are produced across windings 61 and 62 in response to the polarity of current $i$ such as shown in FIG. 15a, respectively. Therefore, output voltage $e_o$ corresponding to the sum $e_1$ and $e_2$, such as shown in FIG. 15d, is obtained between the output terminals 7 and 8.

It is possible to change a condition for producing an output signal, that is, a threshold value by means of changing the turns number of windings 61, 62, etc.

Therefore, if it is assumed that a first circuit C1 comprises magnetic core 41 and windings 51 and 61 and a second circuit C2 comprises magnetic core 42 and windings 52 and 62, both outputs of the first and second circuits C1 and C2 are signal "0" in a condition I, only output of the first circuit C1 is signal "1" in a condition II, and both outputs of the first and second circuits C1 and C2 are signal "1" in a condition III, as shown in FIG. 16. The signals "1" and "0" represent the presence and absence of output voltage, respectively.

Figure 17A:
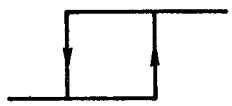
Figure 17B:
Figure 17C:

Thus, the shape of a hysterisis characteristic such as shown in FIG. 17a can be detected by the output voltage of windings 61 and 62. Furthermore, it is possible to detect that a condition to be detected is in or out of any region as shown in FIG. 17b or 17c. For example, if current $I_B$ of the current source 4 corresponds to the circumferential temperature as shown in FIG. 13, the device 29 such as a heater can be controlled so that the device is operated at a temperature $T_1$ and is stopped at a temperature $T_2$. Since the interior and the exterior of any region are decided, for example, it is possible to produce a signal such as an alarm signal for temperature. The boundaries between conditions I, II and III shown in FIG. 16 are arbitrarily decided by changing threshold values of the first and second circuits C1 and C2.

The conception shown in FIG. 14 can be applied to various embodiments shown in FIGS. 8, 11 and 13.

In order to distinguish output signals $e_1$ and $e_2$ from the composite signal $e_0$ in FIG. 14, the polarity of current $i$ is used. That is, the composite signal $e_0$ is rectified synchronously on the basis of the phase of current $i$. The number of magnetic cores may be more than two. In such a case, output signals are independently derived from windings corresponding to the respective magnetic cores since these output signals are not distinguished by a manner such as a synchronous rectification.

Thus, a device having a multiple of functions is realized. Since a circuit to which a current to be detected is applied is isolated in a direction current component from a detecting circuit according to this invention, the interference between these circuits can be eliminated. Since magnetic core is used for detecting, little power is consumed in the detecting circuit. It is possible to change arbitrarily a threshold value.

Since output signal of the detecting circuit is digitally obtained, it is unnecessary to provide a particular circuit for digitization. Furthermore, it is unnecessary to provide particular means except magnetic core such as a ferrite ring core. Therefore, it is possible to realize the detecting circuit which is remarkably compact and light in weight, and further which is unexpensive and reliable. A converter for a variable such as a temperature can be realized by causing the variable to correspond to the value of a resistor, voltage, current, etc.

What is claimed is:

1. A detecting circuit comprising:
   at least one magnetic core having a rectangular magnetic characteristic;
   at least one first winding means coupled magnetically to said magnetic core;
   at least one second winding means coupled magnetically to said magnetic core;
   first power supply means comprising an alternating current source connected to said first winding means, for applying a first current to be detected to said first winding means;
   second power supply means comprising a direct current source connected to said second winding means, for applying a reference current to said second winding means;
   means connected to said second winding means, for deriving at least one output signal from said second winding means; and
   means connected to said first power supply means and said first winding means for changing the first current in response to a condition of an object.

2. A detecting circuit comprising:
   a plurality of magnetic cores each having a rectangular magnetic characteristic;
   a plurality of first coupling means coupled magnetically to the respective magnetic cores, for applying a current to be detected thereto,
   a plurality of second coupling means coupled magnetically to the respective magnetic cores, for deriving at least one output signal therefrom; and
   means for applying a reference current to one of said first and second coupling means.

3. A detecting circuit comprising:
   a plurality of magnetic cores each having a rectangular magnetic characteristic;
   a plurality of first winding means coupled magnetically to the respective magnetic cores;
   a plurality of second winding means coupled magnetically to the respective magnetic cores;
   first power supply means connected to said first winding means, for applying a first current to be detected to said first winding means;

second power supply means connected to said second winding means, for applying a reference current to said second winding means; and means connected to said second winding means, for deriving at least one output signal from said second winding means.

4. A detecting circuit according to claim 3, which further comprises means connected to said first winding means and said first power supply means, for changing the first current in response to a condition of a controlled device.

5. A temperature detecting circuit comprising:
at least one magnetic core having a rectangular magnetic characteristic;
at least one first winding means coupled magnetically to said magnetic core;
at least one second winding means coupled magnetically to said magnetic core;
first power supply means comprising a direct current source connected to said first winding means for applying a first current to be detected to said first winding means;
means connected to said first power supply means and said first winding means, for changing the first current which is applied to said first winding means in response to a temperature of an object;
second power supply means comprising an alternating current source connected to said second winding means for applying a reference current to said second winding means.

6. A control circuit comprising:
at least one magnetic core having a rectangular magnetic characteristic;
at least one first winding means coupled magnetically to said magnetic core;
at least one second winding means coupled magnetically to said magnetic core;
first power supply means for applying a first current to be detected to said first winding means;
a controlled device for changing the first current in response to a condition thereof;
switching means connected so as to form a closed circuit by means of said first winding means, said first power supply means, said controlled means and said switching means, for selectively applying the first current to said controlled device;
second power supply means connected with said second winding means for applying a reference current to said second winding means;
deriving means connected with said second winding means for deriving at least one output signal from said second winding means; and
controlling means connected with said deriving means and said switching means for controlling said switching means in response to the output signal from said deriving means.

7. A control circuit according to claim 6, in which said first and second power supply means comprise an alternating current source and a direct current source.

8. A control circuit according to claim 7, in which said switching means comprises a SCR.

9. A control circuit according to claim 7, which further includes rectifying means connected with said second winding means for rectifying the output signal from said second winding means.

10. A control circuit according to claim 9, in which said controlling means comprises a flip-flop which is reset in response to the output signal from said second winding means, a delay circuit connected with said flip-flop, for delaying the reset signal from said flip-flop and for setting said flip-flop by a delayed reset signal, a driver connected with said flip-flop, for controlling said switching means in response to the reset signal from said flip-flop.

11. A control circuit according to claim 7, in which said controlled means comprises a single phase induction motor.

12. A control circuit according to claim 11, in which said controlled means comprises a starting coil, a capacitor connected with said starting coil and said switching means and a main coil connected in parallel to a series circuit of said starting coil, said capacitor and said switching means.

13. A control circuit according to claim 11, in which said second power supply means comprises a direct current source and a temperature sensitive element connected in series to said direct current source.

14. A control circuit comprising:
a plurality of magnetic cores each having a rectangular magnetic characteristic;
a plurality of first coupling means coupled magnetically to the respective magnetic cores, for applying a current to be detected thereto;
an alternating current source for generating the current to be detected;
load means connected so as to form a closed circuit by means of said plural first coupling means, said alternating current source and said load means for changing the current to be detected;
a plurality of second coupling means coupled magnetically to the respective magnetic cores for deriving at least one output signal therefrom; and
at least one direct current source connected with said plural second winding means for applying a reference current to said plural second winding means.

15. A detecting circuit comprising:
at least one magnetic core having a rectangular magnetic characteristic;
at least one first winding means coupled magnetically to said magnetic core;
at least one second winding means coupled magnetically to said magnetic core;
first power supply means comprising a direct current source connected to said first winding means, for applying a first current to be detected to said first winding means;
second power supply means comprising an alternating current source connected to said second winding means for applying a reference current to said second winding means;
means connected to said second winding means for deriving at least one output signal from said second winding means; and
means connected to said first power supply means and said first winding means for changing the first current in response to a condition of an object.

16. A detecting circuit comprising:
at least one magnetic core having a rectangular magnetic characteristic;
at least one first winding means coupled magnetically to said magnetic core;
at least one second winding means coupled magnetically to said magnetic core;
first power supply means connected to said first winding means for applying a first current to be detected to said first winding means;

second power supply means comprising the series combination of a direct current source and a temperature sensitive element connected to said second winding means for applying a reference current to said second winding means;

means connected to said second winding means for deriving at least one output signal from said second winding means; and load means, switching means, said load means and said switching means connected to said first winding means and said first power supply means so as to form a closed circuit by means of said first winding means, said first power supply means, said load means and said switching means, and controlling means connected to said deriving means and said switching means, for controlling said switching means in response to the output signal from said deriving means.

17. A detecting circuit comprising:

at least one magnetic core having a rectangular magnetic characteristic;

at least one first winding means coupled magnetically to said magnetic core;

at least one second winding means coupled magnetically to said magnetic core;

first power supply means connected to said first winding means for applying a first current to be detected to said first winding means;

second power supply means connected to said second winding means for applying a reference current to said second winding means for applying a reference current to said second winding means;

means connected to said second winding means for deriving at least one output signal from said second winding means;

means connected to said first power supply means and said first winding means for changing the first current in response to a condition of an object; and third power supply means, a controlled device, a switching means connected so as to form a closed circuit by means of said third power supply means, said controlled device and said switching means, and controlling means connected to said deriving means and said switching means, for controlling said switching means in response to the output signal from said deriving means.

* * * * *